US012677431B2

(12) United States Patent
Su et al.

(10) Patent No.: US 12,677,431 B2
(45) Date of Patent: Jul. 7, 2026

(54) GALLIUM NITRIDE-BASED HIGH ELECTRON MOBILITY TRANSISTOR EPITAXIAL WAFER WITH AN InGaN/GaN CAP LAYER COMPRISING FIRST SUBLAYERS DOPED WITH A MAIN DOPING ELEMENT AND SECOND SUBLAYERS DOPED WITH THE FIRST DOPING ELEMENT AND AN AUXILIARY DOPING ELEMENT, AND PREPARATION METHOD THEREFOR

(71) Applicant: HC SEMITEK (ZHEJIANG) CO., LTD., Zhejiang (CN)

(72) Inventors: Chen Su, Jiangsu (CN); Jiahui Hu, Jiangsu (CN); Hui Wang, Jiangsu (CN); Yuanyuan Jiang, Jiangsu (CN); Wubin Zhang, Jiangsu (CN); Peng Li, Jiangsu (CN)

(73) Assignee: HC Semitek (Zhejiang) Co. Ltd., Zhejiang (CN)

( * ) Notice: Subject to any disclaimer, the term of this patent is extended or adjusted under 35 U.S.C. 154(b) by 455 days.

(21) Appl. No.: 18/023,654

(22) PCT Filed: Aug. 27, 2021

(86) PCT No.: PCT/CN2021/114901
§ 371 (c)(1),
(2) Date: Feb. 27, 2023

(87) PCT Pub. No.: WO2022/042672
PCT Pub. Date: Mar. 3, 2022

(65) Prior Publication Data
US 2023/0326996 A1 Oct. 12, 2023

(30) Foreign Application Priority Data
Aug. 28, 2020 (CN) .......................... 202010883958.5

(51) Int. Cl.
*H10D 30/01* (2025.01)
*H10D 30/47* (2025.01)
(Continued)

(52) U.S. Cl.
CPC ......... *H10D 30/015* (2025.01); *H10D 30/475* (2025.01); *H10D 62/60* (2025.01); *H10D 62/8503* (2025.01)

(58) Field of Classification Search
CPC .... H10D 30/015; H10D 30/475; H10D 62/60; H10D 62/8503; H10D 62/854;
(Continued)

(56) References Cited

U.S. PATENT DOCUMENTS

| | | | | |
|---|---|---|---|---|
| 7,800,116 | B2 | 9/2010 | Murata et al. | |
| 8,536,615 | B1 * | 9/2013 | Driscoll | H01L 21/0237 257/101 |
| 2009/0072272 | A1 | 3/2009 | Suh et al. | |
| 2012/0320581 | A1 * | 12/2012 | Rogers | H01L 24/82 257/E33.059 |
| 2018/0240877 | A1 * | 8/2018 | Tsai | H10D 62/8164 |

FOREIGN PATENT DOCUMENTS

| | | |
|---|---|---|
| CN | 102473795 A | 5/2012 |
| CN | 103515495 A | 1/2014 |
(Continued)

OTHER PUBLICATIONS

Translation of CN 107393956 A (Year: 2017).*
(Continued)

*Primary Examiner* — William B Partridge
*Assistant Examiner* — Ilker Ozden
(74) *Attorney, Agent, or Firm* — Morgan, Lewis & Bockius LLP

(57) ABSTRACT
The present application relates to the technical field of semiconductors, and provides a gallium nitride (GaN)-based high electron mobility transistor epitaxial wafer and a preparation method therefor. The GaN-based high electron mobility transistor epitaxial wafer comprises a substrate, and a
(Continued)

buffer layer, a high-resistance buffer layer, a channel layer, an AlGaN barrier layer, and a cap layer which are stacked on the substrate; the cap layer comprises first sublayers and second sublayers which are grown alternately; the first sublayers are GaN layers; the second sublayers are InGaN layers; both the first sublayers and the second sublayers are doped with a main doping element; the main doping element is at least one of Be and Mg; the second sublayers are further doped with an auxiliary doping element; the auxiliary doping element is at least one of O, Mg, Si and Zn.

20 Claims, 2 Drawing Sheets

(51) Int. Cl.
| | |
|---|---|
| *H10D 62/60* | (2025.01) |
| *H10D 62/85* | (2025.01) |

(58) Field of Classification Search
CPC ............ H10D 62/8164; H10D 62/8171; H01L 21/02458; H01L 21/02505; H01L 21/02507; H01L 21/0254; H01L 21/02579; H01L 21/0262; H10P 14/24; H10P 14/3216; H10P 14/3251; H10P 14/3252; H10P 14/3416; H10P 14/3444; Y02P 70/50
See application file for complete search history.

(56) References Cited

FOREIGN PATENT DOCUMENTS

| CN | 104051523 | A | * | 9/2014 | ........... H10D 30/015 |
|---|---|---|---|---|---|
| CN | 107393956 | A | * | 11/2017 | ............ H10D 30/47 |
| CN | 108461539 | A | | 8/2018 | |
| CN | 108886052 | A | | 11/2018 | |
| CN | 110459472 | A | | 11/2019 | |
| CN | 112216742 | A | | 1/2021 | |

OTHER PUBLICATIONS

Translation of CN 107393956 A (Li) (Year: 2017).*
Pantha et al., Appl. Phys. Lett. 95, 261904 (2009), https://doi.org/10.1063/1.3279149 (Year: 2009).*
Translation of CN 104051523 A (Liu) (Year: 2014).*
Itakura et al., AIP Advances 10, 025133 (2020) https://doi.org/10.1063/1.5139591 (Year: 2020).*
Gijing indigo (Zhejiangji) Ltd, First Office Action CN202010883958-5 Jun. 20, 2022.
Gijing indigo (Zhejiangji) Ltd, Notification of Grant, CN202010883958-5, Jan. 5, 2023.
HC Semitek (Zhejiang) Co Ltd, International Search Report and Written Opinion, PCTCN2021114901, Oct. 26, 2021, 15 pgs.
HC Semitek (Zhejiang) Co Ltd, International Preliminary Report on Patentability, PCTCN2021114901, Feb. 28, 2023, 12 pgs.

\* cited by examiner

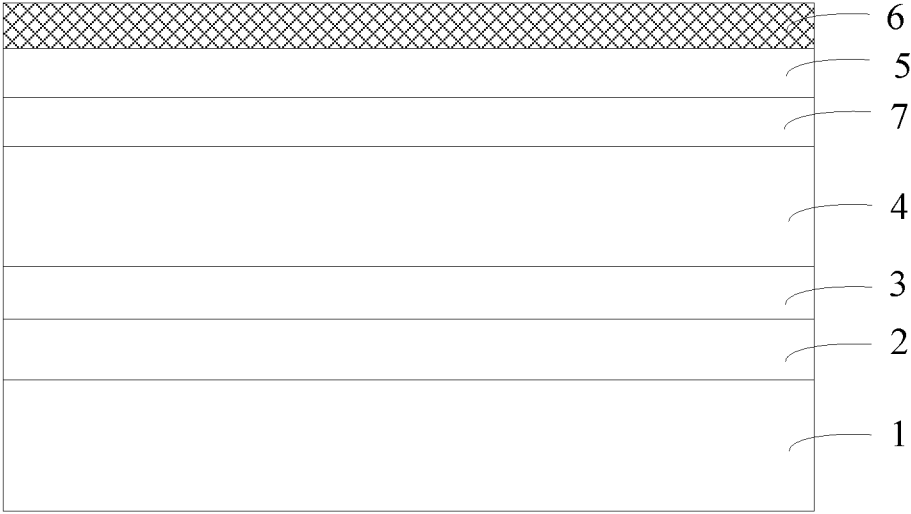
FIG. 1
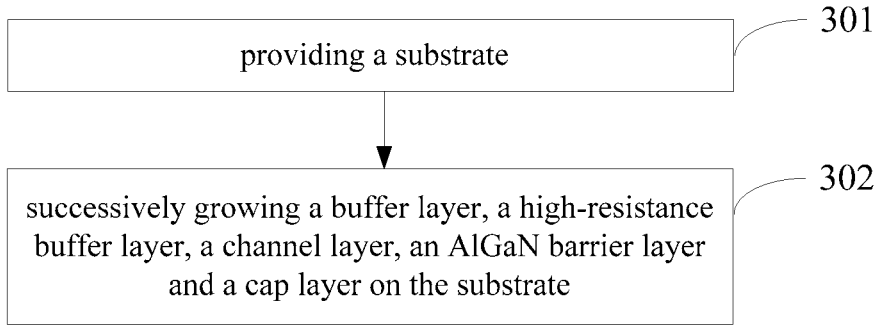
FIG. 2
providing a substrate — 301
successively growing a buffer layer, a high-resistance buffer layer, a channel layer, an AlGaN barrier layer and a cap layer on the substrate — 302
FIG. 3

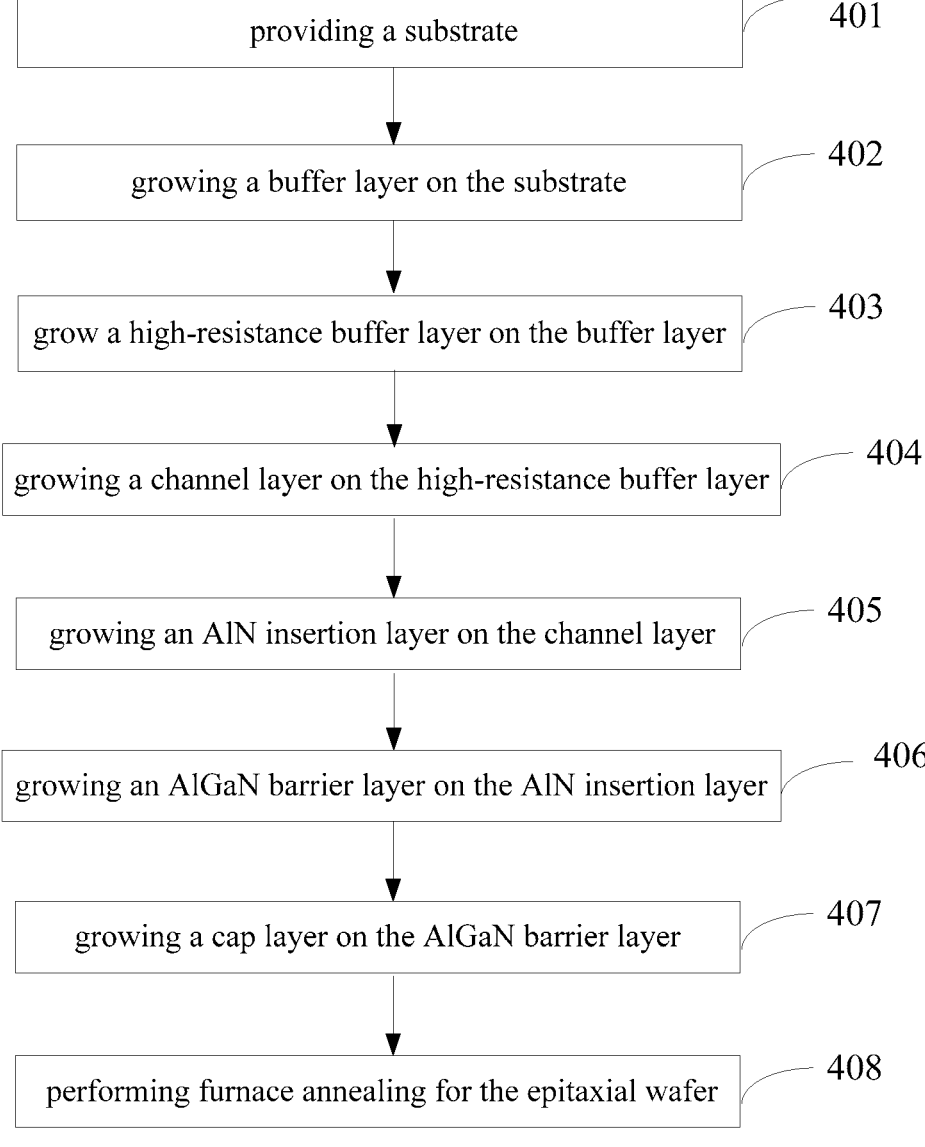

providing a substrate — 401 growing a buffer layer on the substrate — 402 grow a high-resistance buffer layer on the buffer layer — 403 growing a channel layer on the high-resistance buffer layer — 404 growing an AlN insertion layer on the channel layer — 405 growing an AlGaN barrier layer on the AlN insertion layer — 406 growing a cap layer on the AlGaN barrier layer — 407 performing furnace annealing for the epitaxial wafer — 408

FIG. 4

GALLIUM NITRIDE-BASED HIGH ELECTRON MOBILITY TRANSISTOR EPITAXIAL WAFER WITH AN InGaN/GaN CAP LAYER COMPRISING FIRST SUBLAYERS DOPED WITH A MAIN DOPING ELEMENT AND SECOND SUBLAYERS DOPED WITH THE FIRST DOPING ELEMENT AND AN AUXILIARY DOPING ELEMENT, AND PREPARATION METHOD THEREFOR

CROSS-REFERENCE TO RELATED APPLICATIONS

The present disclosure application is a United States National Stage Application filed under 35 U.S.C. § 371 of PCT Patent Application Serial No. PCT/CN2021/114901, filed on Aug. 27, 2021, which claims the benefit of priority to Chinese Patent Application No. 202010883958.5, filed on Aug. 28, 2020 and entitled "GALLIUM NITRIDE-BASED HIGH ELECTRON MOBILITY TRANSISTOR EPITAXIAL WAFER AND PREPARATION METHOD THEREFOR", all of which are incorporated herein by reference in their entirety.

FIELD

The present disclosure relates to the technical field of semiconductors, and in particular, to a gallium nitride-based high electron mobility transistor epitaxial wafer and a preparation method therefor.

BACKGROUND

A GaN (gallium nitride)-based HEMT (High Electron Mobility Transistor) has high current density, critical breakdown voltage and electron mobility, and has very important application value in the fields of microwave power and high-temperature electronic devices.

The GaN-based HEMT usually includes a chip, and a source, a drain and a gate on the chip. The chip is obtained from an epitaxial wafer. A structure of the epitaxial wafer generally includes a substrate, and a buffer layer, a high-resistance buffer layer, a channel layer, an AlGaN barrier layer and a P-type GaN cap layer which are successively stacked on the substrate.

In general, employed in the P-type GaN cap layer is performing doping with Mg, but Mg doping presents a problem of higher activation energy caused by being easily passivated by H (hydrogen). The ionization rate of Mg is very low, and a relatively higher dopant concentration is required to achieve P-type doping. Moreover, Mg as an acceptor will also form a MgGa-VN complex with N vacancies in GaN, thereby generating self-compensation effects and resulting in lower carrier concentration.

SUMMARY

Embodiments of the present disclosure provide a GaN-based high electron mobility transistor epitaxial wafer and a preparation method therefor, which can reduce the generation of complex and decrease the activation energy of P-type dopant in the cap layer, thus obtaining a P-type cap layer with high dopant concentration. The technical scheme is as follows:

At least one embodiment of the present disclosure provides a GaN-based high electron mobility transistor epitaxial wafer, the GaN-based high electron mobility transistor epitaxial wafer comprises a substrate, and a buffer layer, a high-resistance buffer layer, a channel layer, an AlGaN barrier layer and a cap layer which are successively stacked on the substrate.

The cap layer comprises first sublayers and second sublayers which are grown alternately; the first sublayers are GaN layers; the second sublayers are InGaN layers; both the first sublayers and the second sublayers are doped with a main doping element; the main doping element is at least one of Be and Mg; the second sublayers are further doped with an auxiliary doping element; the auxiliary doping element is at least one of O, Mg, Si and Zn.

Optionally, dopant concentrations of the main doping element in the first sublayers and the second sublayers all range from $1*10^{19}$ cm$^{-3}$ to $9*10^{21}$ cm$^{-3}$.

Optionally, dopant concentrations of the auxiliary doping element in the second sublayers range from $1*10^{18}$ cm$^{-3}$ to $5*10^{21}$ cm$^{-3}$.

Optionally, a ratio of the dopant concentration of the main doping element to the dopant concentration of the auxiliary doping element in the second sublayer ranges from 1:1 to 5:1.

Optionally, the dopant concentration of In in the second sublayer ranges from 10 cm$^{-3}$ to $10^4$ cm$^{-3}$.

Optionally, the cap layer comprises n periods of alternately grown first sublayers and second sublayers, $1 \leq n \leq 10$.

Optionally, a total thickness of the cap layer ranges from 50 nm to 150 nm.

Optionally, a thickness of the first sublayer ranges from 5 nm to 20 nm, and a thickness of the second sublayer ranges from 10 nm to 30 nm.

At least one embodiment of the present disclosure provides a preparation method for a GaN-based high electron mobility transistor epitaxial wafer, the preparation method comprises:

providing a substrate;

successively growing a buffer layer, a high-resistance buffer layer, a channel layer, an AlGaN barrier layer and a cap layer on the substrate;

the cap layer comprises first sublayers and second sublayers which are grown alternately; the first sublayers are GaN layers; the second sublayers are InGaN layers; both the first sublayers and the second sublayers are doped with a main doping element; the main doping element is at least one of Be and Mg; the second sublayers are further doped with an auxiliary doping element; the auxiliary doping element is at least one of O, Mg, Si and Zn.

Optionally, the step of successively growing the buffer layer, the high-resistance buffer layer, the channel layer, the AlGaN barrier layer and the cap layer on the substrate comprises:

growing the cap layer on the AlGaN barrier layer under conditions where a growth temperature ranges from 800° C. to 1050° C. and a growth pressure ranges from 50 torr to 600 torr.

Optionally, the preparation method also comprises:

performing furnace annealing for the epitaxial wafer after growing the cap layer.

Optionally, an annealing temperature ranges from 600° C. to 900° C. and an annealing time ranges from 5 min to 10 min.

BRIEF DESCRIPTION OF THE DRAWINGS

FIG. 1 is a schematic structural diagram of a GaN-based high electron mobility transistor epitaxial wafer provided by an embodiment of the present disclosure;

FIG. 2 is a schematic structural diagram of a cap layer provided by an embodiment of the present disclosure;

FIG. 3 is a flowchart of one preparation method for a GaN-based high electron mobility transistor epitaxial wafer provided by an embodiment of the present disclosure;

FIG. 4 is a flow chart of another preparation method for a GaN-based high electron mobility transistor epitaxial wafer provided by an embodiment of the present disclosure.

DETAILED DESCRIPTIONS

To make the objectives, technical solutions and advantages of the present disclosure clearer, the following further describes the embodiments of the present disclosure in detail with reference to the accompanying drawings.

In recent years, gallium nitride-based power electronic devices have attracted attention from many people. A GaN material can form a heterojunction structure with materials such as aluminum gallium nitrogen and indium gallium nitrogen. Due to spontaneous polarization and piezoelectric polarization effects of a barrier layer material, a two-dimensional electron gas (2DEG) with a high concentration will be formed at an interface of the heterojunction. Because the GaN material is advantageous in large forbidden band width, high electron mobility, high electron saturation velocity and high breakdown field strength, the gallium-nitride-based HEMT (High Electron Mobility Transistor) has become a research hotspot in microwave power field and circuit field in the past decade.

Although the gallium-nitride-based HEMT has many advantages, they also encounter many problems. One of them is that the gallium nitride-based HEMT produced by conventional process is of depletion mode (threshold voltage Vth<0 V). Because a turn-off voltage is negative, the circuit design of depletion-mode HEMT is much more complex than that of enhanced-mode HEMT (Vth>0 V), which increases the cost of HEMT circuit. The enhanced-mode HEMT is an important part of high-speed switches, high temperature GaN integrated circuits (RFIC) and microwave monolithic integrated circuits (MMIC). In an application sense, the enhanced-mode HEMT has advantages that are incomparable over the depletion-mode HEMT. In the fields of microwave power amplifiers and low-noise power amplifiers, the enhanced-mode HEMT does not need negative voltages, which reduces the complexity, size and cost of the circuit. In the field of high power switches, the enhanced-mode HEMT can improve the security of circuits. Therefore, researches on enhanced-mode gallium nitride-based HEMT devices are necessary.

FIG. 1 is a schematic structural diagram of a GaN-based high electron mobility transistor epitaxial wafer provided by an embodiment of the present disclosure. As shown in FIG. 1, the GaN-based high electron mobility transistor epitaxial wafer comprises a substrate 1, and a buffer layer 2, a high-resistance buffer layer 3, a channel layer 4, an AlGaN barrier layer 5 and a cap layer 6 which are stacked on the substrate 1.

FIG. 2 is a schematic structural diagram of a cap layer provided by an embodiment of the present disclosure. As shown in FIG. 2, the cap layer 6 comprises first sublayers 61 and second sublayers 62 which are grown alternately. The first sublayers 61 are GaN layers, and the second sublayers 62 are InGaN layers. Both the first sublayers 61 and the second sublayers 62 are doped with a main doping element, and the main doping element is at least one of Be and Mg.

The second sublayers 62 are further doped with an auxiliary doping element, and the auxiliary doping element is at least one of O, Mg, Si and Zn.

Illustratively, the main doping element is one of Be and Mg, and the auxiliary doping element is one of O, Mg, Si and Zn.

In the embodiment of the present disclosure, the cap layer is set to a structure that the first sublayers and second sublayers are grown alternately, and the first sublayers are GaN layers, the second sublayers are InGaN layers, both the first sublayers and the second sublayers are doped with at least one of Be and Mg, and the at least one of Be and Mg is P-type dopant. Because In is an impurity and introducing too much will affect the crystal quality of the epitaxial wafer, a small amount of In is intermittently introduced at the time of growing the GaN cap layer, thereby forming alternating first and second sublayers. The first sublayers are formed at the time In is not introduced in, and the second sublayers are formed at the time In is introduced in, which can reduce influence of In impurity on the crystal quality of the epitaxial wafer. In can inhibit the incorporation of Ga atoms, which will increase the effective V/III ratio of the surface of the cap layer, thus inhibiting the formation of N vacancies and thereby preventing Mg or Be doped in the cap layer from forming a complex with N vacancies and producing self-compensation effects, ensuring the effective carrier concentration. At the same time, Mg or Be is served as an acceptor, on the one hand, the auxiliary doping element such as O or Si doped in the second sublayers can be a donor impurity to reduce the activation energy of the acceptor, thus improving the effective dopant concentration of P-type dopant in the cap layer. On the other hand, the auxiliary doping element Mg or Zn doped in the second sublayers can be served as an acceptor to further improve the dopant concentration of the P-type dopant in the cap layer, thereby finally obtaining the P-type cap layer with high dopant concentration.

In the embodiment of the present disclosure, the second sublayer 62 is co-doped with two elements such as Be—Mg, Be—O, Be—Si, Mg—O, Mg—Si, Mg—Zn where the former is the main doping element, and the latter is the auxiliary doping element.

Optionally, dopant concentrations of the main doping element in the first sublayers 61 and the second sublayers 62 all range from $1*10^{19}$ cm$^{-3}$ to ~$9*10^{21}$ cm$^{-3}$.

If the dopant concentration of the main doping element is too low, the dopant concentration of the acceptor will be quite low, making the cap layer ultimately unable to be P-type. If the dopant concentration of the main doping element is too high, the carrier scattering will be strengthened and the carrier mobility will be significantly reduced. By setting the dopant concentration of the main doping element within the above range, the cap layer can be ensured to be ultimately P-type and the carrier mobility can be improved.

Illustratively, the dopant concentrations of the main doping element in the first sublayers 61 and the second sublayers 62 all range from $1*10^{19}$ cm$^{-3}$ to $5*10^{20}$ cm$^{-3}$.

Optionally, dopant concentrations of the auxiliary doping element in the second sublayers 62 range from $1*10^{18}$ cm$^{-3}$ to $5*10^{21}$ cm$^{-3}$.

If the dopant concentration of the auxiliary doping element is too low, it will be unable to achieve the effects of reducing the activation energy of the acceptor and improving the effective dopant concentration of the P-type dopant in the cap layer. If the dopant concentration of the auxiliary doping element is too high, not only will the dopant concentration of the donor be quite high, resulting in the cap layer ultimately unable to be P-type, but also will the epitaxial wafer have increased defects, making the crystal quality worsen. By setting the dopant concentration of the auxiliary doping element within the above range, the effective dopant concentration of the P-type dopant in the cap layer can be increased, and the defects of the epitaxial wafer can be reduced, thus the crystal quality can be improved.

Illustratively, the dopant concentrations of auxiliary doping element in the second sublayers 62 range from $1*10^{18}$ cm$^{-3}$ to $3*10^{20}$ cm$^{-3}$.

Optionally, a ratio of the dopant concentration of the main doping element to the dopant concentration of the auxiliary doping element in the second sublayer 62 ranges from 1:1 to 5:1.

If the ratio of the dopant concentration of the main doping element to the dopant concentration of the auxiliary doping element is less than 1:1, the proportion of the main doping element will be too small, thus the dopant concentration of the acceptor will be quite low, which will cause the cap layer to be ultimately unable to be P-type. If the ratio of the dopant concentration of the main doping element to the dopant concentration of the auxiliary doping element is greater than 5:1, the dopant concentration of the donor impurity in the auxiliary doping element will be too low, thus it will be unable to achieve the effects of reducing the activation energy of the acceptor and improving the dopant concentration of the P-type dopant in the cap layer. By setting the ratio of the dopant concentration of the main doping element to the dopant concentration of the auxiliary doping element within the above range, the cap layer can be ensured to be ultimately P-type and the effective dopant concentration of P-type dopant in the cap layer can be increased.

Illustratively, the ratio of the dopant concentration of the main doping element to the dopant concentration of the auxiliary doping element in the second sublayer 62 is 2:1 or 3:1.

Optionally, the dopant concentration of In in the second sublayer 62 ranges from 10 cm$^{-3}$ to $10^4$ cm$^{-3}$.

If the dopant concentration of In is too high, the quality of epitaxial wafer will become poor. If the dopant concentration of In is too low, it will be unable to achieve the effects of inhibiting the incorporation of Ga atoms, increasing the effective V/III ratio of the surface of the cap layer, and thus inhibiting the formation of N vacancies, preventing Mg or Be doped in the cap layer from forming complex with N vacancies and producing self-compensation effect. By setting the dopant concentration of In in the second sublayer 62 within the above range, the quality of epitaxial wafer can be guaranteed, and Mg or Be doped in the cap layer can be prevented from forming a complex with the N vacancy, thus ensuring the effective carrier concentration.

Illustratively, the dopant concentration of In in the second sublayer 62 ranges from $10^2$ cm$^{-3}$ to $10^3$ cm$_{-3}$.

Optionally, the cap layer 6 comprises n periods of alternately grown first sublayers 61 and second sublayers 62. The thickness of the cap layer 6 ranges from 50 nm to 150 nm.

If the thickness of the cap layer 6 is less than 50 nm, it will be unable to obtain a GaN-based enhanced-mode high electron mobility transistor device. If the thickness of the cap layer 6 is greater than 150 nm, the concentration of the two-dimensional electron gas at the interface of GaN/AlGaN heterojunction will be affected because of the cap layer too thick. By setting the thickness of the cap layer 6 within the above range, the GaN-based enhanced-mode high electron mobility transistor device can be realized, and the conceneb;normal;jtration of the two-dimensional electron gas at the interface of the GaN/AlGaN heterojunction can be guaranteed.

Illustratively, the thickness of the cap layer 6 is 100 nm.

Optionally, the buffer layer 2 is an AlN/AlGaN layer, and the thickness of the AlN layer ranges from 100 nm to 300 nm, and the thickness of the AlGaN layer ranges from 0.5 um to 1.5 um.

Optionally, the high-resistance buffer layer 3 is an Al$_x$Ga$_{1-x}$N/GaN superlattice structure, 0<x<1. The thickness of Al$_x$Ga$_{1-x}$N is 5 nm ~20 nm, and the thickness of GaN layer is 10 nm~30 nm. The high-resistance buffer layer 3 can achieve the beneficial effect of dislocation filtering, thus improving the crystal quality of the epitaxial wafer.

Optionally, the channel layer 4 is a GaN layer with a thickness ranging from 50 nm to 300 nm. The channel layer 4 is a transport channel for the two-dimensional electron gas, which requires a smooth surface and a low dopant concentration to reduce the scattering of the two-dimensional electron gas.

Optionally, the GaN-based high electron mobility transistor epitaxial wafer also comprises an AlN insertion layer 7 disposed between the channel layer 4 and the AlGaN barrier layer 5. The thickness of the AlN insertion layer 7 ranges from 0.2 nm to 2 nm. By setting the AlN insertion layer 7, the polarization effect of the interface can be increased, the scattering of the interface can be reduced, and the concentration and mobility of the two-dimensional electron gas can be significantly improved.

Optionally, the thickness of the AlGaN barrier layer 5 ranges from 30 nm to 100 nm. The AlGaN barrier layer 5 will generate a large amount of positive polarized charges at the interface between the barrier layer 5 and the channel layer 4 by the action of its own great spontaneous polarization or piezoelectric polarization effect, and the polarized positive charges can attract electrons, thus forming the two-dimensional electron gas FIG. 3 is a flowchart of one preparation method for a GaN-based high electron mobility transistor epitaxial wafer provided by an embodiment of the present disclosure. As shown in FIG. 3, the preparation method comprises:

Step 301: providing a substrate;

Step 302: successively growing a buffer layer, a high-resistance buffer layer, a channel layer, an AlGaN barrier layer and a cap layer on the substrate.

The cap layer comprises first sublayers and second sublayers which are grown alternately. The first sublayers are GaN layers, and the second sublayers are InGaN layers. Both the first sublayers and the second sublayers are doped with a main doping element, and the main doping element is at least one of Be and Mg. The second sublayers are further doped with an auxiliary doping element, and the auxiliary doping element is at least one of O, Mg, Si and Zn.

In the embodiment of the present disclosure, the cap layer is set to a structure that the first sublayers and second sublayers are grown alternately, and the first sublayers are GaN layers, the second sublayers are InGaN layers, both the first sublayers and the second sublayers are doped with at least one of Be and Mg, and the at least one of Be and Mg is P-type dopant. Because In is an impurity and introducing too much will affect the crystal quality of the epitaxial wafer, a small amount of In is intermittently introduced at the time of growing the GaN cap layer, thereby forming alternating first and second sublayers. The first sublayers are formed at the time In is not introduced in, and the second sublayers are formed at the time In is introduced in, which can reduce influence of In impurity on the crystal quality of the epitaxial wafer. In can inhibit the incorporation of Ga atoms, which will increase the effective V/III ratio of the surface of the cap layer, thus inhibiting the formation of N vacancies and thereby preventing Mg or Be doped in the cap layer from forming a complex with N vacancies and producing self-compensation effects, ensuring the effective carrier concentration. At the same time, Mg or Be is served as an acceptor, on the one hand, the auxiliary doping element such as O or Si doped in the second sublayers can be a donor impurity to reduce the activation energy of the acceptor, thus improving the effective dopant concentration of P-type dopant in the cap layer. On the other hand, the auxiliary doping element Mg or Zn doped in the second sublayers can be served as an acceptor to further improve the dopant concentration of the P-type dopant in the cap layer, thereby finally obtaining the P-type cap layer with high dopant concentration.

FIG. 4 is a flowchart of a preparation method for another GaN-based high electron mobility transistor epitaxial wafer provided by an embodiment of the present disclosure. As shown in FIG. 4, the preparation method includes:

Step 401: providing a substrate;

Illustratively, the substrate can be a sapphire, Si or SiC substrate.

It should be noted that, in the embodiment of the present disclosure, MOCVD (Metal Organic Chemical Vapor Deposition) may be employed to successively grow a buffer layer, a high-resistance buffer layer, a channel layer, an AlN insertion layer, an AlGaN barrier layer and a cap layer on the substrate. The temperature and the pressure controlled during the growth process actually refers to the temperature and the pressure in the reaction chamber of the MOCVD equipment.

Illustratively, high-purity ammonia ($NH_3$) is used as an nitrogen source, trimethyl gallium (TMGa) or triethyl gallium (TEGa) is used as a gallium source, trimethyl aluminum (TMAl) is used as an aluminum source Illustratively, step 401 may also include:

performing a high temperature hydrogen annealing treatment on the substrate.

The annealing treatment method includes: processing the substrate at high temperature for 5 to 6 minutes under a hydrogen gas (as a carrier gas) atmosphere in the reaction chamber of MOCVD equipment. The temperature of the reaction chamber ranges from 1000° C. to 1100° C., and the pressure of the reaction chamber is controlled within a range from 200 torr to 500 torr.

Step 402: growing a buffer layer on the substrate.

The buffer layer is an AlN/AlGaN layer.

Illustratively, under the conditions where the atmosphere is pure hydrogen gas, the temperature ranges from 600° C. to 900° C., and the reaction chamber pressure ranges from 25 torr to 200 torr, TMAl is introduced as group III source, and $NH_3$ is introduced as group V source with a ratio of V to III ranging from 100 to 2000, and the AlN layer with a thickness ranging from 100 nm to 300 nm is grown.

Illustratively, under the conditions where the atmosphere is pure hydrogen gas, the temperature ranges from 950° C. to 1050° C., and the reaction chamber pressure ranges from 25 torr to 200 torr, TMAl/TMGa are introduced as group III source, and $NH_3$ is introduced as group V source with a ratio of V to III ranging from 100 to 2000, and the AlGaN layer with a thickness ranging from 0.5 um to 1.5 um is grown.

Step 403: growing a high-resistance buffer layer on the buffer layer.

The high-resistance buffer layer is an $Al_xGa_{1-x}N/GaN$ superlattice structure, $0<x<1$.

Illustratively, under the conditions where the atmosphere is pure hydrogen gas, the temperature ranges from 950° C. to 1050° C., and the reaction chamber pressure ranges from 25 torr to 200 torr, TMAl/TMGa are introduced as group III source, and $NH_3$ is introduced as group V source with a ratio of V to III ranging from 100 to 2000, and the $Al_xGa_{1-x}N$ layer with a thickness ranging from 5 nm to 20 nm is grown.

Under the conditions where the atmosphere is pure hydrogen gas, the temperature ranges from 950° C. to 1050° C., and the reaction chamber pressure ranges from 25 torr to 200 torr, TMGa is introduced as group III source, $NH_3$ is introduced as group V source with a ratio of V to III ranging from 100 to 2000, and the GaN layer with a thickness ranging from 10 nm to 30 nm is grown.

Step 404: growing a channel layer on the high-resistance buffer layer.

Illustratively, under the conditions where the atmosphere is a mixture of a nitrogen gas and a hydrogen gas, the temperature ranges from 1000° C. to 1200 ° C., and the reaction chamber pressure ranges from 100 torr to 500 torr, TMGa is introduced as group III source, and $NH_3$ is introduced as group V source with a ratio of V to III ranging from 5000 to 10000, and the GaN channel layer with a thickness ranging from 50 nm to 300 nm is grown.

Step 405: growing an AlN insertion layer on the channel layer.

Illustratively, under the conditions where the atmosphere is pure nitrogen gas, the temperature ranges from 800° C. to 1050° C., and the reaction chamber pressure ranges from 50 torr to 200 torr, TMAl is introduced as group III source, $NH_3$ is introduced as group V source with a ratio of V to III ranging from 100 to 2000, and the AlN insertion layer with a thickness ranging from 0.2 nm to 2 nm is grown.

Step 406: growing an AlGaN barrier layer on the MN insertion layer.

Illustratively, under the conditions where the atmosphere is pure hydrogen gas, the temperature ranges from 950° C to 1000° C., the reaction chamber pressure ranges from 100 torr to 200 torr, TMGa and TMAl are introduced as group III sources, $NH_3$ is introduced as group V source with a ratio of V to III ranging from 5000 to 10000, and the AlGaN barrier layer with a thickness ranging from 30 nm to 100 nm is grown.

Step 407, growing a cap layer on the AlGaN barrier layer.

The cap layer comprises first sublayers and second sublayers which are grown alternately. The first sublayers are GaN layers, and the second sublayers are InGaN layers. Both the first sublayers and the second sublayers are doped with a main doping element, and the main doping element is at least one of Be and Mg. The second sublayers are further doped with an auxiliary doping element, and the auxiliary doping element is at least one of O, Mg, Si and Zn.

In the embodiment of the present disclosure, the second sublayer 62 is co-doped with two elements such as Be—Mg, Be—O, Be—Si, Mg—O, Mg—Si, Mg—Zn where the former is the main doping element, and the latter is the auxiliary doping element.

Optionally, dopant concentrations of the main doping element in the first sublayers and the second sublayers all range from $1*10^{19}$ $cm^{-3}$ to ~$9*10^{21}$ $cm^{-3}$.

If the dopant concentration of the main doping element is too low, the dopant concentration of the acceptor will be quite low, making the cap layer ultimately unable to be P-type. If the dopant concentration of the main doping element is too high, the carrier scattering will be strengthened and the carrier mobility will be significantly reduced.

Optionally, dopant concentrations of the auxiliary doping element in the second sublayers 62 range from $1*10^{18}$ cm$^{-3}$ to $5*10^{21}$ cm$^{-3}$.

If the dopant concentration of the auxiliary doping element is too low, it will be unable to achieve the effects of reducing the activation energy of the acceptor and improving the effective dopant concentration of the P-type dopant in the cap layer. If the dopant concentration of the auxiliary doping element is too high, not only will the dopant concentration of the donor be quite high, resulting in the cap layer ultimately unable to be P-type, but also will the epitaxial wafer have increased defects, making the crystal quality worsen.

Optionally, a ratio of the dopant concentration of the main doping element to the dopant concentration of the auxiliary doping element in the second sublayer 62 ranges from 1:1 to 5:1.

If the ratio of the dopant concentration of the main doping element to the dopant concentration of the auxiliary doping element is less than 1:1, the proportion of the main doping element will be too small, thus the dopant concentration of the acceptor will be quite low, which will cause the cap layer to be ultimately unable to be P-type. If the ratio of the dopant concentration of the main doping element to the dopant concentration of the auxiliary doping element is greater than 5:1, the dopant concentration of the donor impurity in the auxiliary doping element will be too low, thus it will be unable to achieve the effects of reducing the activation energy of the acceptor and improving the dopant concentration of the P-type dopant in the cap layer.

Optionally, the dopant concentration of In in the second sublayer 62 ranges from 10 cm$^{-3}$ $10^4$ cm$_{-3}$.

If the dopant concentration of In is too high, the quality of epitaxial wafer will become poor. If the dopant concentration of In is too low, it will be unable to achieve the effects of inhibiting the incorporation of Ga atoms, increasing the effective V/III ratio of the surface of the cap layer, and thus inhibiting the formation of N vacancies, preventing Mg or Be doped in the cap layer from forming complex with N vacancies and producing self-compensation effect.

Optionally, the cap layer 6 comprises n periods of alternately grown first sublayers 61 and second sublayers 62. The thickness of the cap layer 6 ranges from 50 nm to 150 nm.

If the thickness of the cap layer 6 is less than 50 nm, it will be unable to obtain a GaN-based enhanced-mode high electron mobility transistor device. If the thickness of the cap layer 6 is greater than 150 nm, the concentration of the two-dimensional electron gas at the interface of GaN/AlGaN heterojunction will be affected because of the cap layer too thick.

Illustratively, the thickness of the cap layer 6 is 100 nm.
Illustratively, step 407 may include:
Under the conditions where the atmosphere is a mixture of a nitrogen gas and a hydrogen gas, the temperature ranges from 800° C. to 1050 ° C., and the reaction chamber pressure ranges from 50 torr to 600 torr, TMGa is introduced as group III source, and NH$_3$ is introduced as group V source with a ratio of V to III ranging from 100 to 5000, and the cap layer with a thickness ranging from 50 nm to 150 nm is grown.

Illustratively, the reaction chamber pressure ranges from 50 torr to 300 torr when growing the cap layer.

Step 408: performing furnace annealing for the epitaxial wafer.

Illustratively, after termination of the epitaxial growth, the temperature inside the reaction chamber of the MOCVD equipment is decreased, and the annealing treatment is performed in nitrogen atmosphere with an annealing temperature ranging from 600° C. to 900° C. and an annealing time ranging from 5 minutes to 15 minutes, and then the temperature is lowered to room temperature to complete the epitaxial growth. The decomposition of the complex in the cap layer can be strengthened by annealing the epitaxial wafer, thereby facilitating activating the Mg acceptor passivated by H and providing carriers for P-type conductance.

In the embodiment of the present disclosure, the cap layer is set to a structure that the first sublayers and second sublayers are grown alternately, and the first sublayers are GaN layers, the second sublayers are InGaN layers, both the first sublayers and the second sublayers are doped with at least one of Be and Mg, and the at least one of Be and Mg is P-type dopant. Because In is an impurity and introducing too much will affect the crystal quality of the epitaxial wafer, a small amount of In is intermittently introduced at the time of growing the GaN cap layer, thereby forming alternating first and second sublayers. The first sublayers are formed at the time In is not introduced in, and the second sublayers are formed at the time In is introduced in, which can reduce influence of In impurity on the crystal quality of the epitaxial wafer. In can inhibit the incorporation of Ga atoms, which will increase the effective V/III ratio of the surface of the cap layer, thus inhibiting the formation of N vacancies and preventing Mg or Be doped in the cap layer from forming a complex with N vacancies and producing self-compensation effects, ensuring the effective carrier concentration. At the same time, Mg or Be is served as an acceptor, on the one hand, the auxiliary doping element such as O or Si doped in the second sublayers can be a donor impurity to reduce the activation energy of the acceptor, thus improving the effective dopant concentration of P-type dopant in the cap layer. On the other hand, the auxiliary doping element Mg or Zn doped in the second sublayers can be served as an acceptor to further improve the dopant concentration of the P-type dopant in the cap layer, thereby finally obtaining the P-type cap layer with high dopant concentration.

The above are only optional embodiments of the present disclosure, and are not intended to limit the present disclosure. Any modification, equivalent replacement, improvements, etc. made within the spirit and principle of the present disclosure may fall within the protection scope of the present disclosure.

What is claimed is:
1. A GaN-based high electron mobility transistor epitaxial wafer, comprising:
a substrate; and
a plurality of layers further including a buffer layer, a high-resistance buffer layer, a channel layer, an AlGaN barrier layer, and a cap layer, the plurality of layers being successively stacked on the substrate; wherein:
the cap layer comprises first sublayers and second sublayers, the first sublayers and the second sublayers being alternately arranged;
the first sublayers are GaN layers;
the second sublayers are InGaN layers, wherein a dopant concentration of In in the second sublayers ranges from 10 cm$^{-3}$ to 104 cm$^{-3}$;
both the first sublayers and the second sublayers are doped with a main doping element;
the main doping element is at least one of Be and Mg;
the second sublayers are further doped with an auxiliary doping element; and
the auxiliary doping element is at least one of O, Mg, Si and Zn.
2. The GaN-based high electron mobility transistor epitaxial wafer of claim 1, wherein dopant concentrations of the main doping element in the first sublayers and the second sublayers all range from $1*10^{19}$ cm$^{-3}$ to $9*10^{21}$ cm$^{-3}$.

3. The GaN-based high electron mobility transistor epitaxial wafer of claim 1, wherein dopant concentrations of the auxiliary doping element in the second sublayers range from $1*10^{18}$ cm$^{-3}$ to $5*10^{21}$ cm$^{-3}$.

4. The GaN-based high electron mobility transistor epitaxial wafer of claim 1, wherein a ratio of a dopant concentration of the main doping element to a dopant concentration of the auxiliary doping element in the second sublayers ranges from 1:1 to 5:1.

5. The GaN-based high electron mobility transistor epitaxial wafer of claim 1, wherein the cap layer comprises n periods of alternately grown first sublayers and second sublayers, 1≤n≤10.

6. The GaN-based high electron mobility transistor epitaxial wafer of claim 1, wherein a total thickness of the cap layer ranges from 50 nm to 150 nm.

7. The GaN-based high electron mobility transistor epitaxial wafer of claim 6, wherein a thickness of each of the first sublayers ranges from 5 nm to 20 nm, and a thickness of each of the second sublayers ranges from 10 nm to 30 nm.

8. A method for preparing a GaN-based high electron mobility transistor epitaxial wafer, comprising:
    providing a substrate; and
    successively growing a buffer layer, a high-resistance buffer layer, a channel layer, an AlGaN barrier layer, and a cap layer on the substrate, wherein:
        the cap layer comprises first sublayers and second sublayers which are grown alternately;
        the first sublayers are GaN layers;
        the second sublayers are InGaN layers wherein a dopant concentration of In in the second sublayers ranges from 10 cm$^{-3}$ to $10^4$ cm$^{-3}$;
        both the first sublayers and the second sublayers are doped with a main doping element;
        the main doping element is at least one of Be and Mg;
        the second sublayers are further doped with an auxiliary doping element; and
        the auxiliary doping element is at least one of O, Mg, Si and Zn.

9. The method of claim 8, wherein the step of successively growing the buffer layer, the high-resistance buffer layer, the channel layer, the AlGaN barrier layer and the cap layer on the substrate further comprises:
    growing the cap layer on the AlGaN barrier layer under conditions where a growth temperature ranges from 800° C. to 1050° C. and a growth pressure ranges from 50 torr to 600 torr.

10. The method of claim 8, further comprising:
    performing furnace annealing for the GaN-based high electron mobility transistor epitaxial wafer after growing the cap layer.

11. The method of claim 10, wherein an annealing temperature ranges from 600° C. to 900° C. and an annealing time ranges from 5 min to 10 min.

12. The method of claim 8, wherein the cap layer comprises n periods of alternately grown first sublayers and second sublayers, 1≤n≤10.

13. The method of claim 8, wherein a thickness of each of the first sublayers ranges from 5 nm to 20 nm, and a thickness of each of the second sublayers ranges from 10 nm to 30 nm.

14. An electronic device, comprising:
    a substrate; and
    a plurality of layers further including a buffer layer, a high-resistance buffer layer, a channel layer, an AlGaN barrier layer, and a cap layer, the plurality of layers being successively stacked on the substrate; wherein:
        the cap layer comprises first sublayers and second sublayers, the first sublayers and the second sublayers being alternately arranged;
        the first sublayers are GaN layers;
        the second sublayers are InGaN layers, wherein a dopant concentration of In in the second sublayers ranges from 10 cm$^{-3}$ to $10^4$ cm$^{-3}$;
        both the first sublayers and the second sublayers are doped with a main doping element;
        the main doping element is at least one of Be and Mg;
        the second sublayers are further doped with an auxiliary doping element; and
        the auxiliary doping element is at least one of O, Mg, Si and Zn.

15. The electronic device of claim 14, wherein dopant concentrations of the main doping element in the first sublayers and the second sublayers all range from $1*10^{19}$ cm$^{-3}$ to $9*10^{21}$ cm$^{-3}$.

16. The electronic device of claim 14, wherein dopant concentrations of the auxiliary doping element in the second sublayers range from $1*10^{18}$ cm$^{-3}$ to $5*10^{21}$ cm$^{-3}$.

17. The electronic device of claim 14, wherein a ratio of a dopant concentration of the main doping element to a dopant concentration of the auxiliary doping element in the second sublayers ranges from 1:1 to 5:1.

18. The electronic device of claim 14, wherein the cap layer comprises n periods of alternately grown first sublayers and second sublayers, 1≤n≤10.

19. The electronic device of claim 14, wherein a total thickness of the cap layer ranges from 50 nm to 150 nm.

20. The electronic device of claim 19, wherein a thickness of each of the first sublayers ranges from 5 nm to 20 nm, and a thickness of each of each of the second sublayers ranges from 10 nm to 30 nm.

*    *    *    *    *